(12) United States Patent
Yu et al.

(10) Patent No.: US 11,456,171 B2
(45) Date of Patent: Sep. 27, 2022

(54) DEEP TRENCH INTEGRATION PROCESSES AND DEVICES

(71) Applicant: Applied Materials, Inc., Santa Clara, CA (US)

(72) Inventors: Lan Yu, Albany, NY (US); Tyler Sherwood, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/953,577

(22) Filed: Nov. 20, 2020

(65) Prior Publication Data

US 2022/0165564 A1 May 26, 2022

(51) Int. Cl.
*H01L 21/02* (2006.01)
*H01L 29/06* (2006.01)
*H01L 21/762* (2006.01)

(52) U.S. Cl.
CPC .. *H01L 21/02178* (2013.01); *H01L 21/02164* (2013.01); *H01L 21/02381* (2013.01); *H01L 21/76224* (2013.01); *H01L 29/0649* (2013.01)

(58) Field of Classification Search
CPC ......... H01L 21/02178; H01L 21/02164; H01L 21/02381; H01L 21/76224; H01L 29/0649; H01L 28/161
USPC .......................... 438/207, 436; 257/374, 750
See application file for complete search history.

(56) References Cited

U.S. PATENT DOCUMENTS

2009/0277867 A1 11/2009 Mayer et al.
2012/0190169 A1* 7/2012 Chin et al. ........ H01L 21/76232
　　　　　　　　　　　　　　　　　　　　　438/430
2015/0348784 A1 12/2015 Granahan

FOREIGN PATENT DOCUMENTS

KR 　　2004-0002241 A 　 1/2004
KR 　　　10-0532962 B1 　12/2005
KR 　　2010-0032039 A 　 3/2010

OTHER PUBLICATIONS

International Search Report and Written Opinion dated Mar. 14, 2021 in International Patent Application No. PCT/US2021/059722, 10 pages.

* cited by examiner

*Primary Examiner* — Thinh T Nguyen
(74) *Attorney, Agent, or Firm* — Kilpatrick Townsend & Stockton LLP

(57) ABSTRACT

Exemplary methods of forming a semiconductor structure may include forming a liner along sidewalls of a trench defined from a first surface of a semiconductor substrate. The liner may extend along the first surface of the semiconductor substrate. The methods may include filling the trench with a dielectric material. The methods may include removing the dielectric material and the liner from the first surface of the semiconductor substrate. The methods may include forming a layer of the liner across the first surface of the semiconductor substrate and the trench defined within the semiconductor substrate.

12 Claims, 4 Drawing Sheets

DEEP TRENCH INTEGRATION PROCESSES AND DEVICES

TECHNICAL FIELD

The present technology relates to semiconductor processes and products. More specifically, the present technology relates to producing semiconductor structures and the devices formed.

BACKGROUND

Integrated circuits are made possible by processes which produce intricately patterned material layers on substrate surfaces. Producing patterned material on a substrate requires controlled methods for deposition and removal of materials. However, with new device designs, producing high quality layers of material may be challenging.

Thus, there is a need for improved systems and methods that can be used to produce high quality devices and structures. These and other needs are addressed by the present technology.

SUMMARY

Exemplary methods of forming a semiconductor structure may include forming a liner along sidewalls of a trench defined from a first surface of a semiconductor substrate. The liner may extend along the first surface of the semiconductor substrate. The methods may include filling the trench with a dielectric material. The methods may include removing the dielectric material and the liner from the first surface of the semiconductor substrate. The methods may include forming a layer of the liner across the first surface of the semiconductor substrate and the trench defined within the semiconductor substrate.

In some embodiments, the layer of the liner across the first surface of the semiconductor substrate may be characterized by a thickness different than a thickness of the liner along sidewalls of the trench. The thickness of the liner along sidewalls of the trench may be less than or about 5 nm. Removing the dielectric material and the liner may include performing a chemical-mechanical polishing operation to remove the dielectric material from the first surface of the semiconductor substrate. The liner may be or include aluminum oxide. The semiconductor substrate may be or include silicon. The dielectric material may be or include silicon oxide. The liner may be formed conformally along exposed portions of the semiconductor substrate. A seam may be formed in the dielectric material within the trench.

The methods may include forming a layer of silicon oxide between the liner and the semiconductor substrate. The methods may include forming an additional layer of the dielectric material over the layer of the liner across the first surface of the semiconductor substrate. The methods may include annealing the semiconductor structure. The methods may include forming a recess within the additional layer of the dielectric material and the layer of the liner across the first surface of the semiconductor substrate. The methods may include performing a plasma operation. Ions formed in the plasma operation may affect a charge of the layer of the liner across the first surface of the semiconductor substrate.

Some embodiments of the present technology may encompass methods of forming a semiconductor structure. The method may include forming a liner along sidewalls of a first trench and a second trench defined from a first surface of a semiconductor substrate. The liner may extend along the first surface of the semiconductor substrate. The methods may include filling the first trench and the second trench with a dielectric material. The methods may include removing the dielectric material and the liner from the first surface of the semiconductor substrate. The methods may include forming a layer of the liner across the first surface of the semiconductor substrate and the first trench and second trench defined within the semiconductor substrate. The methods may include forming a recess through the layer of the liner across the first surface of the semiconductor substrate in a region between the first trench and the second trench.

In some embodiments, the liner may be or include aluminum oxide, and the semiconductor substrate may be or include n-doped silicon. The methods may include forming a layer of silicon oxide between the liner and the semiconductor substrate. The methods may include forming an additional layer of silicon oxide across the first surface of the semiconductor substrate subsequent to removing the dielectric material. The methods may include forming an additional layer of the dielectric material over the layer of the liner across the first surface of the semiconductor substrate. The methods may include annealing the semiconductor structure. The layer of the liner across the first surface of the semiconductor substrate may be characterized by a thickness different than a thickness of the liner along sidewalls of the first trench and the second trench. Removing the dielectric material and the liner may include performing a chemical-mechanical polishing operation to remove the dielectric material from the first surface of the semiconductor substrate.

Some embodiments of the present technology may encompass semiconductor structures including a substrate defining a first trench and a second trench from a first surface of a semiconductor substrate. The structures may include a first liner layer extending along sidewalls of the first trench and the second trench. The structures may include a dielectric material at least partially filling the first trench and the second trench. The structures may include a second liner layer extending at least partially along the first surface of the semiconductor substrate. The second liner layer may be characterized by a different thickness than the first liner layer. The structures may include a layer of the dielectric material at least partially extending along the second liner layer. The layer of the dielectric material overlying the first trench and the second trench may be separated from the dielectric material at least partially filling the first trench and the second trench by the second liner layer. In some embodiments, the first liner layer and the second liner layer may be or include aluminum oxide, and the substrate may be or include n-doped silicon.

Such technology may provide numerous benefits over conventional systems and techniques. For example, the processes may produce devices with tunable charge balancing for any number of devices. Additionally, the processes may allow forming charge balance layers to accommodate downstream processes that may impact layers of the structure. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
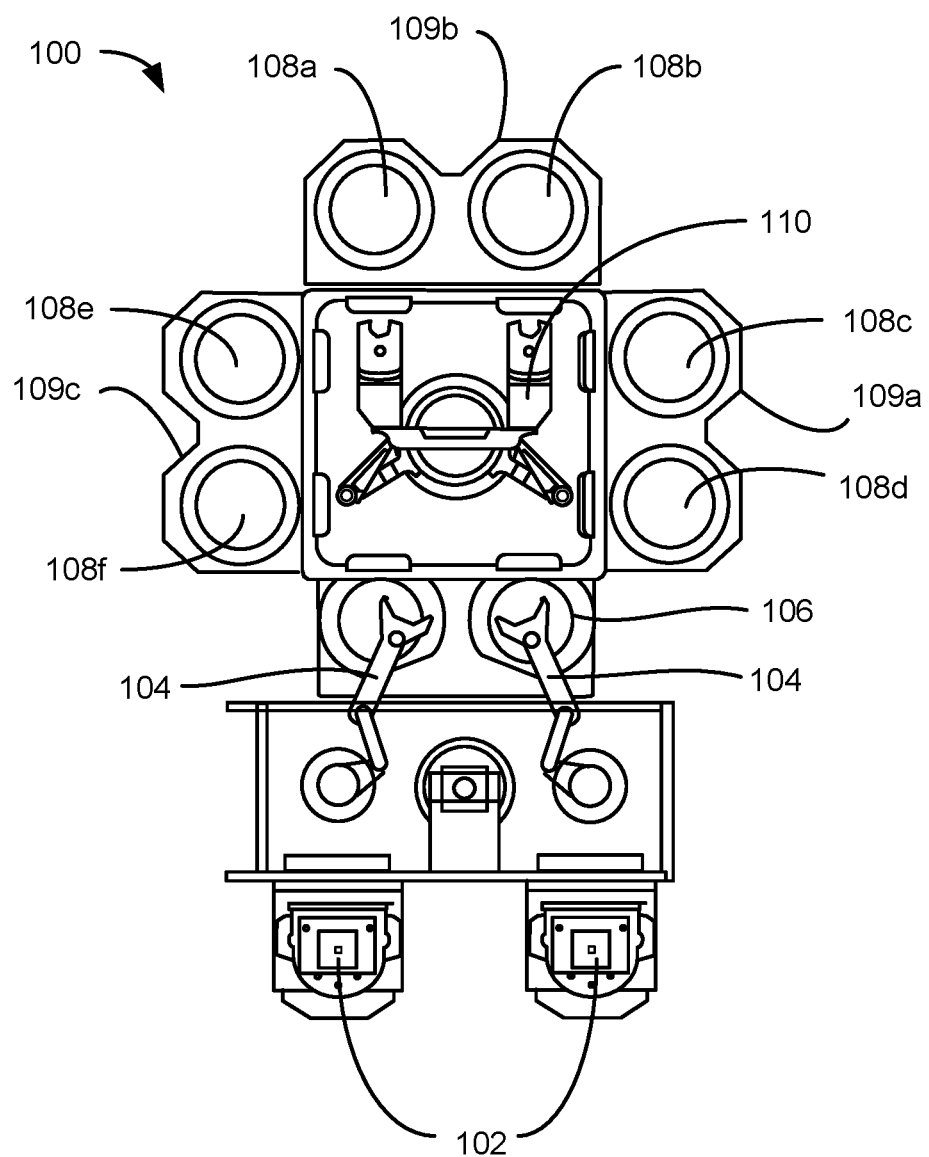
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As devices produced in semiconductor processing continue to shrink, uniformity, material quality, process control, and repeatability are becoming more challenging from process to process. To continue to improve device performance at reduced scale, alternative films and processes are being investigated for additional performance improvements relative to conventional devices.

For example, in power devices, including power diodes, many structures are formed over silicon carbide or gallium nitride, which may be prohibitively expensive. However, to use alternative materials, such as silicon, as a device substrate for high-power devices including at or above 500 V, charge balancing becomes more difficult to achieve between various regions of the device. Additionally, power diodes may be characterized by a deep trench formed to facilitate charge balancing between n-semiconductor materials and p-semiconductor materials of the device. To improve device scaling, a thin layer of highly p-type charged material may be used to balance the n-type charge of the silicon, which allows a reduction in the dimension of p-region materials.

During formation operations for some power devices, a layer of material to provide charge balancing may extend along sidewalls of the trenches formed, as well as along planar or horizontal surfaces of structures formed along the substrate. This layer, which may be a liner, may balance charge through the trench as well as along the surfaces of the substrate. However, this layer may be sensitive to downstream processes, which may include plasma processing. Ions formed in the plasma may have an increased effect on planar surfaces, such as along a surface from which trenches may be formed on the substrate. The ions may impact the charge provided by the liner layer, and thus the liner may impart a different charge effect on the substrate within a trench defined through the substrate than on the substrate along regions across an upper surface of the substrate. Accordingly, charge across the structure may not be properly balanced.

Where the structure may form contact landings, such as for an anode in a diode, as one non-limiting example, an active region may be formed between two trenches, and edge regions on the outside of each trench may expose planar regions of the substrate to the liner for charge balancing. Because of the effect on the liner from downstream processing, the liner layer may not properly balance the charge along these edge regions. Consequently, breakdown may occur sooner in these regions relative to the active region. Conventional processing may be limited to conformal formation of the liner layer to ensure equal thickness across the substrate, and along trenches that may extend for dozens of micrometers or more. Hence, these technologies may be incapable of addressing the effect on liner layers used to balance charge on device structures.

The present technology may overcome these issues by removing the liner layer across the surface of the substrate during processing. By reforming the liner structure in a subsequent operation, the liner may be formed to account for downstream processing, which may allow a tuned layer to be formed, and which may provide a balanced charge structure regardless of subsequent plasma processing. Although the remaining disclosure will routinely identify specific structures, such as diodes, for which the present structures and methods may be employed, it will be readily understood that the systems and methods are equally applicable to any number of structures and devices that may benefit from liner formation or charge balancing or impacting operations during semiconductor processing. Accordingly, the technology should not be considered to be so limited as for use with any particular structures alone. Moreover, although an exemplary tool system will be described to provide foundation for the present technology, it is to be understood that the present technology can be produced in any number of semiconductor processing chambers and tools that may perform some or all of the operations to be described.

FIG. 1 shows a top plan view of one embodiment of a processing system 100 of deposition, etching, baking, and curing chambers according to some embodiments of the present technology. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, anneal, plasma processing, degas, orientation, and other substrate processes.

The substrate processing chambers 108a-f may include one or more system components for depositing, annealing, curing and/or etching a material film on the substrate or wafer. In one configuration, two pairs of the processing chambers, for example 108c-d and 108e-f, may be used to deposit material on the substrate, and the third pair of processing chambers, for example 108a-b, may be used to cure, anneal, or treat the deposited films. In another configuration, all three pairs of chambers, for example 108a-f, may be configured to both deposit and cure a film on the substrate. Any one or more of the processes described may be carried out in additional chambers separated from the fabrication system shown in different embodiments. It will be appreciated that additional configurations of deposition, etching, annealing, and curing chambers for material films are contemplated by system 100. Additionally, any number of other processing systems may be utilized with the present technology, which may incorporate chambers for performing any of the specific operations. In some embodiments, chamber systems which may provide access to multiple processing chambers while maintaining a vacuum environment in various sections, such as the noted holding and transfer areas, may allow operations to be performed in multiple chambers while maintaining a particular vacuum environment between discrete processes.

Figure 2:
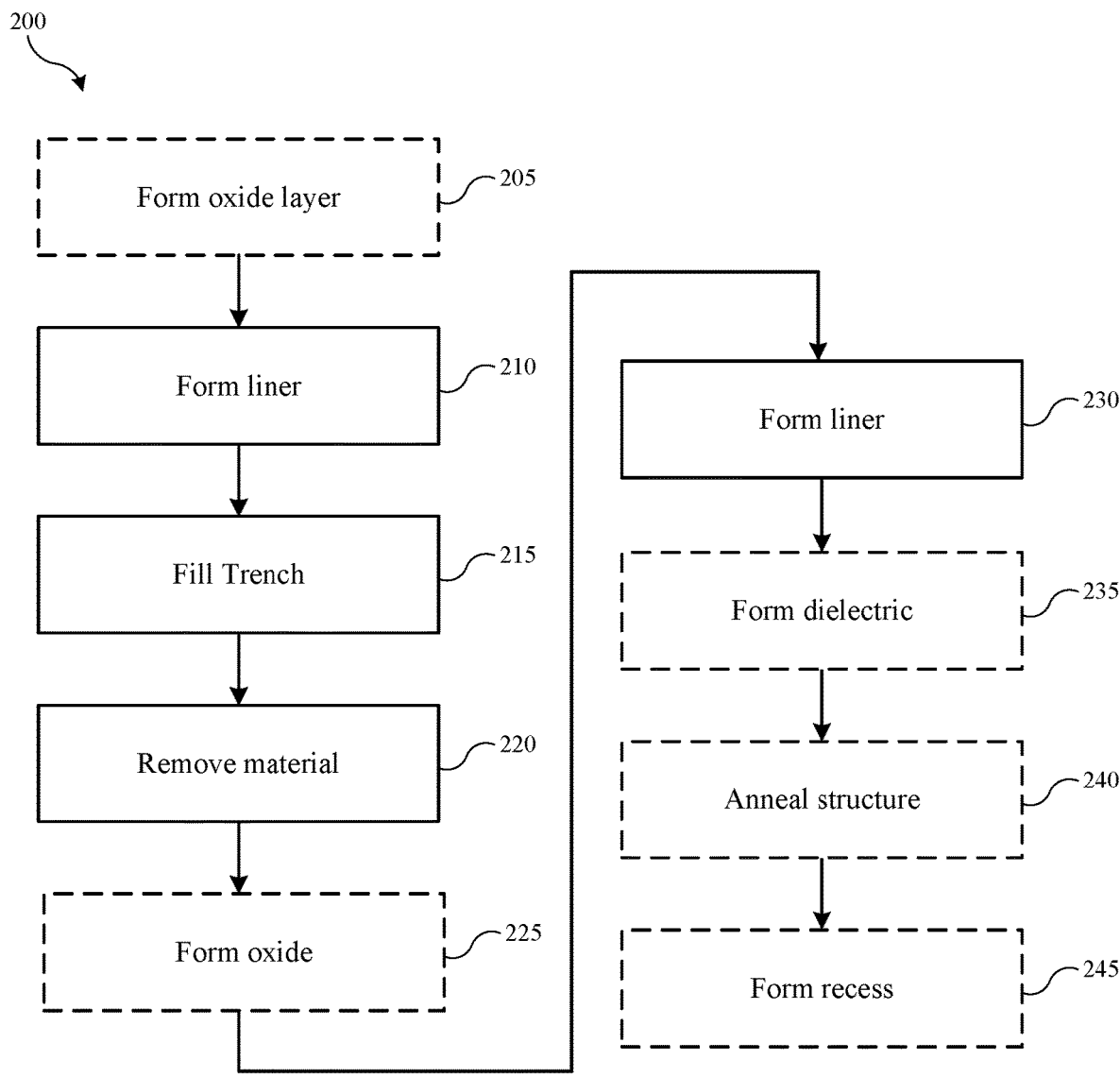
FIG. 2 shows exemplary operations in a method of forming semiconductor devices according to some embodiments of the present technology.

System 100, or more specifically chambers incorporated into system 100 or other processing systems, may be used to produce structures according to some embodiments of the present technology. FIG. 2 shows exemplary operations in a method 200 of forming a semiconductor structure according to some embodiments of the present technology. Method 200 may be performed in one or more processing chambers, such as chambers incorporated in system 100, for example. Method 200 may or may not include one or more operations prior to the initiation of the method, including front-end processing, deposition, etching, polishing, cleaning, or any other operations that may be performed prior to the described operations. The method may include a number of optional operations as denoted in the figure, which may or may not be specifically associated with some embodiments of methods according to the present technology. Method 200 describes operations shown schematically in FIGS. 3A-3D, the illustrations of which will be described in conjunction with the operations of method 200. It is to be understood that FIG. 3 illustrates only partial schematic views with limited details, and in some embodiments a substrate may contain any number of semiconductor sections having aspects as illustrated in the figures, as well as alternative structural aspects that may still benefit from any of the aspects of the present technology.

Figure 3A:
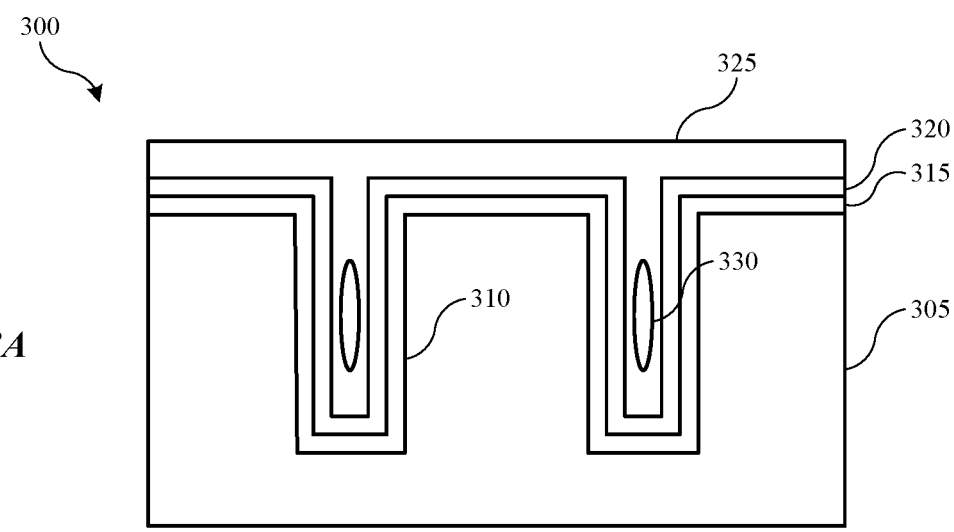
FIGS. 3A-3D show cross-sectional views of substrates being processed according to some embodiments of the present technology.

Method 200 may involve optional operations to develop the semiconductor structure to a particular fabrication operation. Although in some embodiments method 200 may be performed on a base structure, in some embodiments the method may be performed subsequent other material formation. As illustrated in FIG. 3A, the semiconductor structure may represent a device 300 after front-end or other processing has been completed. For example, substrate 305 may be a planar material, or may be a structured device, which may include multiple materials configured as posts, trenches, or other structures as would be understood are similarly encompassed by the present technology. Substrate 305 may include any number of conductive and/or dielectric materials including metals, including transition metals, post-transition metals, metalloids, oxides, nitrides, and carbides of any of these materials, as well as any other materials that may be incorporated within a structure. In some embodiments, substrate 305 may be or include silicon, which may be doped by any number of materials, as well as silicon-containing or gallium-containing materials. The doping may be n+ or n− in some operations, and the silicon may be formed or grown by any number of techniques. Additionally, in embodiments, one or more doped regions may be included in the substrate. For example any number of n- or p-doping regions may be included on the substrate.

The substrate may include one or more features formed across the substrate, including one or more trenches formed from a first surface of the substrate. The trenches may be deep trench features for diodes or other power device structures, as well as any other feature formed within a semiconductor substrate. The trench may facilitate producing a targeted breakdown voltage through the structure materials, and may be characterized by an increased aspect ratio. For example, each trench may be characterized by a depth-to-width ratio of greater than or about 10, and may be greater than or about 15, greater than or about 20, greater than or about 25, greater than or about 30, greater than or about 35, greater than or about 40, greater than or about 45, greater than or about 50, or higher. Between the trenches, an active region may be disposed, which may be a landing for an anode or cathode, and outside the trenches may be edge termination regions. Each of these regions may be charge balanced against the substrate, as explained above. While the trenches may facilitate balancing of interior regions, the edge regions may be at least partially charge balanced along the upper surface of the substrate where the liner extends. Accordingly, and as previously explained, any impact on the charge provided by this liner layer, such as by downstream processing, may cause an imbalance that may lead to breakdown earlier in the edge regions than in other regions on the substrate, which may affect device quality or performance.

One or more material layers may be formed over some or all of substrate 305, which may or may not be part of processing methods according to embodiments of the present technology. The layers may be formed within one or more trenches 310 formed across the substrate, and which may include a first trench and a second trench in some embodiments. For example, an optional oxide layer 315 may be formed at optional operation 205. The oxide layer may be silicon oxide or any other material that may receive a dipole driven from an overlying layer, and which may work with a charge on the substrate 305. The oxide layer may be formed conformally across the substrate as illustrated, and may be formed to a substantially or essentially conformal thickness across the substrate and along the trenches.

At operation 210, a liner layer may be formed across the substrate and along the trenches. The liner layer may be a conformal layer formed across the substrate and each of the features. As illustrated in FIG. 3A, liner layer 320 may extend similarly across the oxide layer, when formed across the substrate. The liner may be a charge balancing layer, and may include any material configured to accommodate a charge of the substrate. As one non-limiting example, the liner layer may be aluminum oxide, or some other metal oxide. The trench may subsequently be filled in operation 215, and may be filled with a dielectric material 325, such as silicon dioxide, or any other fill or dielectric material. As illustrated in the figure, because the trench may be a deep trench feature for a power device, a seam 330 may be formed within the trench in some embodiments.

Figure 3B:
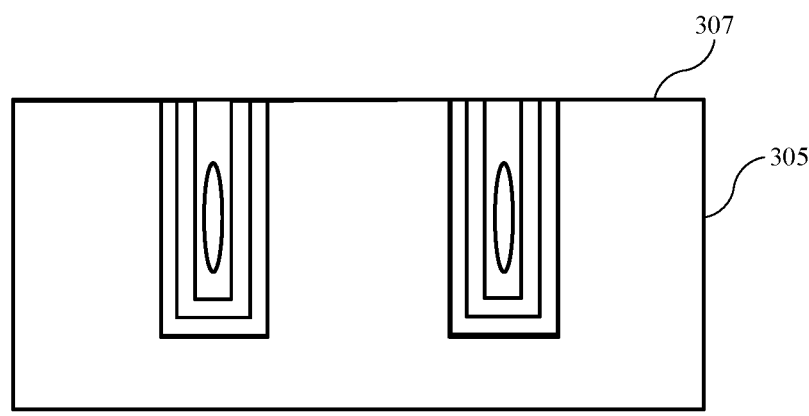

Method 200 may include removing material from the substrate at operation 220. The removal may be performed in any number of ways, including plasma etching, wet etching, dry etching, or chemical-mechanical polishing. While some conventional technologies may perform a contact opening to access specific regions of the semiconductor substrate, in some embodiments the present technology may fully remove the layers overlying the semiconductor substrate. For example, a chemical-mechanical polishing operation may be performed to remove the dielectric material from the substrate, as well as portions of the liner material and oxide material overlying planar regions of the substrate. As illustrated in FIG. 3B, in some embodiments the removal operation may remove some or all overlying materials to expose the semiconductor substrate 305, including fully exposing the remaining regions of the semiconductor substrate, such as exposing a first surface 307 of the substrate. By fully removing the liner along planar regions of the substrate, the present technology may re-define the liner layer on overlying regions of the substrate, which may allow a tuning process to accommodate subsequent operations. For example, as previously described, some subsequent processing may include plasma processing. Ions contacting the substrate may affect the charge balancing of the planar or horizontal regions of the liner, affecting breakdown across the device. By removing the liner layer across the top surface of the substrate, a subsequent liner formation may be performed, which may preemptively accommodate any downstream charge balancing effect on the structure.

Figure 3C:
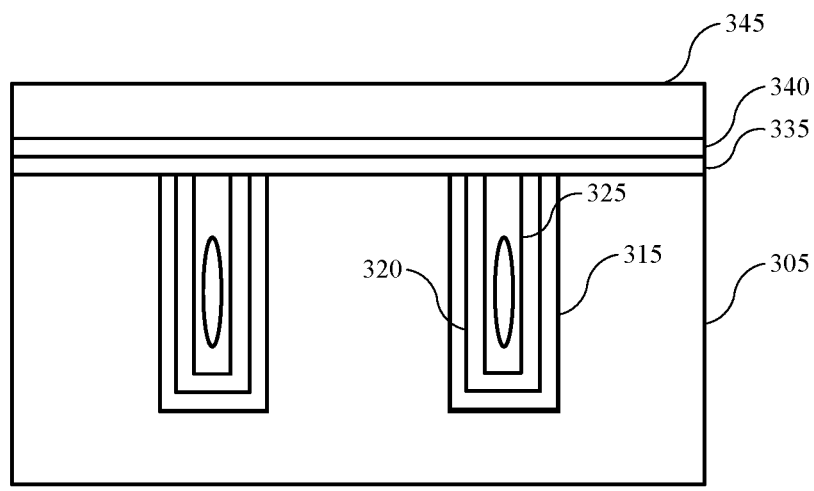

Accordingly, in some embodiments, subsequent processing may reform materials overlying the substrate, which may be fully planarized. For example, a subsequent oxide layer 335 may be formed in optional operation 225, and as shown in FIG. 3C. The oxide layer 335 may be formed fully across the substrate overlying the previously formed materials, which may remain in the trench structures. As illustrated, initial oxide layer 315, liner layer 320, and fill material 325 may each remain in the trenches, and may be covered with oxide material 335, when included. A subsequent liner formation may be performed at operation 230. The liner layer may be a similar material as the liner material previously removed across the substrate, and which may remain within the trench. As illustrated in the figure, liner layer 340 may be formed overlying substrate 305, and may be formed overlying oxide layer 335, when included. The liner layer 340 may similarly be formed fully across the substrate, and may be formed fully across the surface of the substrate, and may fully cover trenches formed in the substrate.

As noted, the oxide and liner layers formed across the substrate may be the same materials formed within the trench. In some embodiments, the liner material formed across the substrate may be formed to a different thickness than the liner material formed within the trenches. The formation of the liner material originally may be a conformal formation across the substrate. Accordingly, when downstream processing affects the planar region of the liner layer, an imbalance may occur, affecting charge breakdown during operation. By forming an additional liner layer across the planar regions of the substrate, the liner may be formed to a different thickness, which may be used to accommodate any downstream processes, and which may ensure a balanced charge across both trench and planar regions of the structure. The liner layer 340 may be formed to a greater or lesser thickness than the liner layer within the trench region.

For example, in some embodiments, the initial liner layer 320 may be formed to a first thickness to maintain a charge balance. The first thickness may be less than or about 5.0 nm, and may be less than or about 4.5 nm, less than or about 4.0 nm, less than or about 3.5 nm, less than or about 3.0 nm, less than or about 2.5 nm, less than or about 2.0 nm, less than or about 1.5 nm, less than or about 1.0 nm, or less, which may help limit trench width. In some embodiments, the second liner layer 340, which may be a similar or different material, may be formed to the same thickness as the initial liner layer, or may be formed to a greater or lesser thickness in some embodiments. For example, in some embodiments, downstream processing may provide additional charge through the layer, and thus the second liner layer 340 may be formed to be characterized by less charge than the initial layer formed. For example, the second liner layer 340 may be formed to a greater thickness than the first liner layer, and may be formed to a thickness of greater than or about 1.0 nm, greater than or about 1.5 nm, greater than or about 2.0 nm, greater than or about 2.5 nm, greater than or about 3.0 nm, greater than or about 3.5 nm, greater than or about 4.0 nm, greater than or about 4.5 nm, greater than or about 5.0 nm, or more, to limit charge at the second liner layer.

After the second liner layer may be formed, an additional layer of dielectric material may be formed across the substrate at optional operation 235. As illustrated in FIG. 3C, dielectric material 345 may be formed across the second liner layer 340. The additional dielectric material 345 may be the same or a different dielectric material as dielectric material 325 included to fill the trench. Accordingly, in some embodiments, any one or more additional oxide layer, liner layer, and dielectric layer may be formed across a planarized substrate. In some embodiments, any number of additional processing operations may be performed in embodiments of the present technology. For example, in some embodiments an anneal operation may be performed at optional operation 240. The anneal may be a high temperature anneal performed over time to activate the charge provided in the liner layer, and drive a dipole to the underlying oxide layer.

Figure 3D:
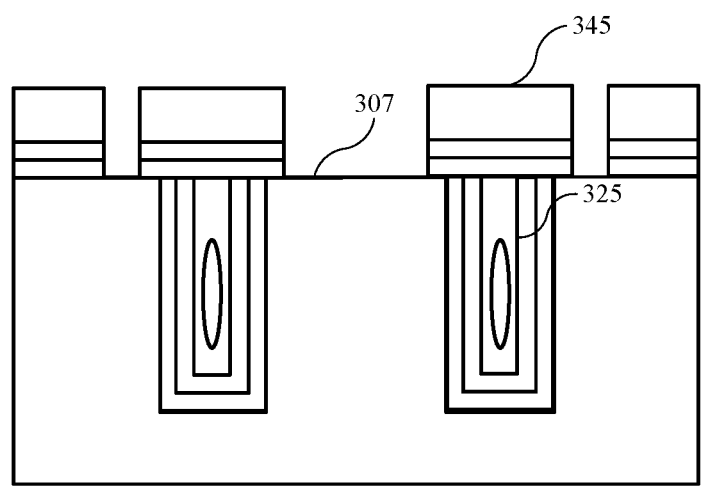

In some embodiments, a subsequent processing operation may produce or form one or more recesses through the overlying materials to expose one or more regions of the substrate. For example, a patterning operation may be performed, and a directional removal or etch may be performed to form one or more recesses at optional operation 245, which may expose regions of the substrate. For example, as illustrated in FIG. 3D, one or more recesses may be formed to expose first surface 307. For example, such as for an anode contact open process, a doped region of the substrate, such as a p+ doped region may be formed at the surface 307 of the substrate 305 between the two trenches. The recess operation may be performed to access this location for a contact operation. The recess operation may extend through one or more locations across the substrate, and may extend through one or more of the dielectric material 345, liner material 340, and oxide material 335, when included.

As illustrated in the figure, the remaining regions of the overlying materials may form a full separation over the trench structures. For example, the originally deposited fill material, such as dielectric material 325, may be separated from the overlying dielectric material in some embodiments. As illustrated, the second liner material 340 may fully separate dielectric material 325 from dielectric material 345 over the trench sections of the substrate. Additionally, in some embodiments a subsequent downstream operation may be performed. The subsequent operation may include plasma processing in some embodiments.

As explained above, this process may produce ions, which may have an impact on the liner layer, especially in planar regions across the substrate, such as along first surface 307. The effect may adjust or further change a charge of the liner layer, which may impact a charge balance between the liner layer and the substrate 305. The effect may be more pronounced along the surface 307 of the semiconductor substrate relative to within the trench structure. By forming a second layer of liner material, such as liner layer 340, the charge may be tuned across the horizontal or planar regions. This tuning, which may be based on layer thickness, may be increased or decreased across these regions, and may fully accommodate any downstream process. Consequently, either prior to or subsequent downstream processing, the liner material may equally balance charge within trench structures, as well as along surface 307 of the substrate 305. By ensuring a balanced charge across the structure, embodiments of the present technology may improve device performance and uniform breakdown across the structure.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a trench" includes a plurality of such trenches, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of forming a semiconductor structure, the method comprising:
    forming a liner along sidewalls of a trench defined from a first surface of a semiconductor substrate, wherein the liner extends along the first surface of the semiconductor substrate;
    filling the trench with a dielectric material;
    removing the dielectric material and the liner from the first surface of the semiconductor substrate; and
    forming a layer of the liner across the first surface of the semiconductor substrate and the trench defined within the semiconductor substrate.

2. The method of forming a semiconductor structure of claim 1, wherein the layer of the liner across the first surface of the semiconductor substrate is characterized by a thickness different than a thickness of the liner along sidewalls of the trench.

3. The method of forming a semiconductor structure of claim 2, wherein the thickness of the liner along sidewalls of the trench is less than or about 5 nm.

4. The method of forming a semiconductor structure of claim 1, wherein removing the dielectric material and the liner comprises:
    performing a chemical-mechanical polishing operation to remove the dielectric material from the first surface of the semiconductor substrate.

5. The method of forming a semiconductor structure of claim 1, wherein the liner comprises aluminum oxide.

6. The method of forming a semiconductor structure of claim 1, wherein the semiconductor substrate comprises silicon.

7. The method of forming a semiconductor structure of claim 1, wherein the dielectric material comprises silicon oxide.

8. The method of forming a semiconductor structure of claim 1, wherein the liner is formed conformally along exposed portions of the semiconductor substrate.

9. The method of forming a semiconductor structure of claim 1, wherein a seam is formed in the dielectric material within the trench.

10. The method of forming a semiconductor structure of claim 1, further comprising:
    forming a layer of silicon oxide between the liner and the semiconductor substrate.

11. The method of forming a semiconductor structure of claim 1, further comprising:
    forming an additional layer of the dielectric material over the layer of the liner across the first surface of the semiconductor substrate;
    annealing the semiconductor structure; and
    forming a recess within the additional layer of the dielectric material and the layer of the liner across the first surface of the semiconductor substrate.

12. The method of forming a semiconductor structure of claim 1, further comprising:
    performing a plasma operation, wherein ions formed in the plasma operation affect a charge of the layer of the liner across the first surface of the semiconductor substrate.

* * * * *